(12) United States Patent
Phillips et al.

(10) Patent No.: US 6,666,611 B2
(45) Date of Patent: Dec. 23, 2003

(54) THREE DEGREE OF FREEDOM JOINT

(75) Inventors: Alton Hugh Phillips, Mountain View, CA (US); Douglas Chandler Watson, Campell, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/865,968

(22) Filed: May 24, 2001

(65) Prior Publication Data

US 2002/0039516 A1 Apr. 4, 2002

Related U.S. Application Data

(60) Provisional application No. 60/226,409, filed on Aug. 18, 2000.

(51) Int. Cl.$^7$ ............................................. F16C 11/00
(52) U.S. Cl. ........................ 403/53; 403/58; 403/220; 267/160
(58) Field of Search ..................... 403/65, 53, 54, 403/58, 112, 220; 248/660, 652, 664, 669; 267/160

(56) References Cited

U.S. PATENT DOCUMENTS

| | | | | | |
|---|---|---|---|---|---|
| 3,203,739 A | * | 8/1965 | Young | ..................... | 267/160 |
| 3,246,890 A | * | 4/1966 | Ormond | ..................... | 267/160 |
| 3,295,808 A | * | 1/1967 | Webb | ..................... | 267/160 |
| 4,311,303 A | * | 1/1982 | Nave | ..................... | 267/160 |
| 4,495,844 A | * | 1/1985 | Jackson et al. | ..................... | 83/715 |
| 4,516,958 A | * | 5/1985 | Phillips | ..................... | 464/153 |
| 4,559,717 A | * | 12/1985 | Scire et al. | ..................... | 33/568 |
| 4,609,302 A | | 9/1986 | Kittell | ..................... | 403/53 |
| 4,667,415 A | | 5/1987 | Barsky | ..................... | 33/568 |
| 5,140,242 A | | 8/1992 | Doran et al. | ..................... | 318/640 |
| 5,241,183 A | | 8/1993 | Kanai et al. | ..................... | 250/453.11 |
| 5,293,782 A | * | 3/1994 | Long et al. | ..................... | 267/160 |
| 5,302,044 A | * | 4/1994 | Spariat et al. | ..................... | 403/291 |
| 5,315,890 A | * | 5/1994 | Long | ..................... | 267/160 |
| 5,392,662 A | * | 2/1995 | Jadrich et al. | ..................... | 403/220 |
| 5,505,521 A | * | 4/1996 | Meiller et al. | ..................... | 297/302.1 |
| 5,529,277 A | * | 6/1996 | Ostaszewski | ..................... | 267/160 |
| 5,699,621 A | | 12/1997 | Trumper et al. | ..................... | 33/1 |
| 5,806,193 A | | 9/1998 | Ebihara | ..................... | 33/1 |
| 6,059,481 A | * | 5/2000 | Genequand | ..................... | 403/220 |
| 6,325,566 B1 | * | 12/2001 | Devine | ..................... | 403/220 |
| 6,398,444 B1 | * | 6/2002 | Salmela | ..................... | 267/160 |
| 6,471,435 B1 | * | 10/2002 | Lee | ..................... | 267/160 |

* cited by examiner

*Primary Examiner*—David Bochna
(74) *Attorney, Agent, or Firm*—Beyer Weaver & Thomas, LLP

(57) ABSTRACT

A three-degree of motion joint comprising a translational joint, a first support member, a first rotational joint, and a second rotational joint. The translational joint allows a first component and a second component to move with respect to each other along the z-axis. The translational joint includes a first translational flexural member that connects a first member and a base member. The first support member is attached to the base member. The first rotational joint allows the first component and the second component to be moved with respect to each other in the $\Theta x$ direction. The first rotational joint includes a first rotational flexural member that is attached to the first member. The second rotational joint allows the first component and second component to move with respect to each other in the $\Theta y$ direction. The second rotational joint includes a second rotational flexural member attached to the first support member.

21 Claims, 9 Drawing Sheets ly low in cost.

THREE DEGREE OF FREEDOM JOINT

CROSS-REFERENCE TO RELATED APPLICATION

This application is also related to U.S. provisional patent application No. 60/226,409, filed on Aug. 18, 2000, entitled "Cantilever Reticle Stage for Electron Beam Projection Lithography System," the content of which is hereby incorporated by reference.

STATEMENT REGARDING FEDERALLY SPONSORED RESEARCH OR DEVELOPMENT

Not Applicable

FIELD OF THE INVENTION

The present invention relates generally to joints, and more specifically to flexural joints used in semiconductor processing machines.

BACKGROUND

Major objectives in the design of semiconductor processing machines include high throughput, low cost, small footprint, and high yield. Achievement of these objectives results in improved return-on-investment (ROI) for the end-user and increased profit and sales for the manufacturer. As demand increases for faster semiconductor devices, semiconductor-processing machines have increasingly required components which are vacuum compatible, non out-gassing, having low or no wear, and having low or no stray magnetic flux. The sum of a machine's performance is a function of its components. One of many types of machine components is a joint.

Joints can be used to maintain a distance between two moving parts of a machine. The maintained distance can be in any combination of six directions (three translational and three rotational). Joints need to be stiff in the directions in which the distance is to be maintained and compliant in the directions in which the distance will vary. Typically, joints require adequate stiffness to minimize vibration amplification between machine components, minimizing positional errors. Additionally, adequate stiffness allows for faster positioning control in the compliant directions. Typically, joints require adequate compliance to minimize the force required to move the parts in the compliant directions. A well-designed joint can improve a machine's performance by increasing throughput, lowering positioning errors, increasing reliability, and by reducing overall machine size and weight.

There is a need, in the design of particular semiconductor processing machines, for a joint having the freedom to move in three directions: z (up-and-down), $\Theta_x$ (rotation about the x-axis), and $\Theta_y$ (rotation about the y-axis). At the same time, such a joint should have high stiffness in the x, y, and $\Theta_z$ directions. Additionally, such a joint should have the following characteristics: non out-gassing, not have stray magnetic flux, no wear nor particulate generation, low or no friction, no "looseness" or "backlash," long life, low or no heat transfer to connected elements, be relatively compact, and be relatively low in cost.

Many conventional joints cannot meet the above requirements. Journal bearing joints have wear and create particles. Ball and roller bearing joints also wear and create particles. Fluid bearings are difficult to seal in a vacuum environment and require pumping and filtration support equipment. Magnetic bearing joints have stray magnetic flux, are large, and require heat removal systems. Therefore, given the above requirements, the best type of joint to use is a flexural joint.

Flexural joints offer the key advantages of: non out-gassing, no stray magnetic flux, no wear nor particulate generation, low or no friction, no "looseness" or "backlash," long life, low or no heat transfer to connected elements, relative compactness, and relatively low cost. Although flexural joints have been used for various application, there exists a need, in the design of particular semiconductor processing machines, for a flexural joint which is compact, relatively free in the z, $\Theta_x$ and $\Theta_y$ directions, and relatively constrained in the x, y, and $\Theta_z$ directions.

SUMMARY

The flexural joint of the present invention includes a translational joint, a first support member, a first rotational joint, and a second rotational joint. The translational joint allows a first component and a second component to be moved with respect to each other along the z-axis. The translational joint includes a first translational flexural member that connects a first rigid member and a base rigid member. The first support member is attached to the base rigid member. The first rotational joint allows the first component and the second component to be moved with respect to each other in the $\Theta x$ direction. The first rotational joint includes a first rotational flexural member that is attached to the first rigid member. The second rotational joint allows the first component and second component to be moved with respect to each other in the $\Theta y$ direction, wherein the second rotational joint includes a second rotational flexural member that is attached to the first support member. The three-degree of freedom joint substantially prevents the first and second components from moving with respect to each other in the x, y, and $\Theta z$ directions. Therefore, the flexural joint allows for minimal vibration amplification between the connected components, smaller positional errors, and faster positioning control in the compliant directions. Throughout this disclosure, the flexural joint of the present invention may be referred to as the "three degree of freedom joint" since it moves in three degrees of motion.

These and other features and advantages of the present invention will be presented in more detail in the following specification of the invention and the accompanying figures, which illustrate by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps have not been described in detail so not to unnecessarily obscure the present invention.

The present invention pertains to a flexural joint that can be attached to two objects and allows for relative motion between the two objects in three degrees of motion. The three degrees of motion in which these two objects may move are those of z, $\Theta_x$ and $\Theta_y$. The flexural joint may be used to guide the motion between components of semiconductor processing machines or between various other types of components. The flexural joint of the present invention includes a translational joint, a first support member, a first rotational joint, and a second rotational joint. The translational joint allows a first component and a second component to be moved with respect to each other along the z-axis. The translational joint includes a first translational flexural member that connects a first rigid member and a base rigid member. The first support member is attached to the base rigid member. The first rotational joint allows the first component and the second component to be moved with respect to each other in the $\Theta x$ direction. The first rotational joint includes a first rotational flexural member that is attached to the first rigid member. The second rotational joint allows the first component and second component to be moved with respect to each other in the $\Theta y$ direction, wherein the second rotational joint includes a second rotational flexural member that is attached to the first support member. The three-degree of freedom joint substantially prevents the first and second components from moving with respect to each other in the x, y, and $\Theta z$ directions. Therefore, the flexural joint allows for minimal vibration amplification between the connected components, smaller positional errors, and faster positioning control in the compliant directions. Throughout this disclosure, the flexural joint of the present invention may be referred to as the "three degree of freedom joint" since it moves in three degrees of motion.

Figure 1:
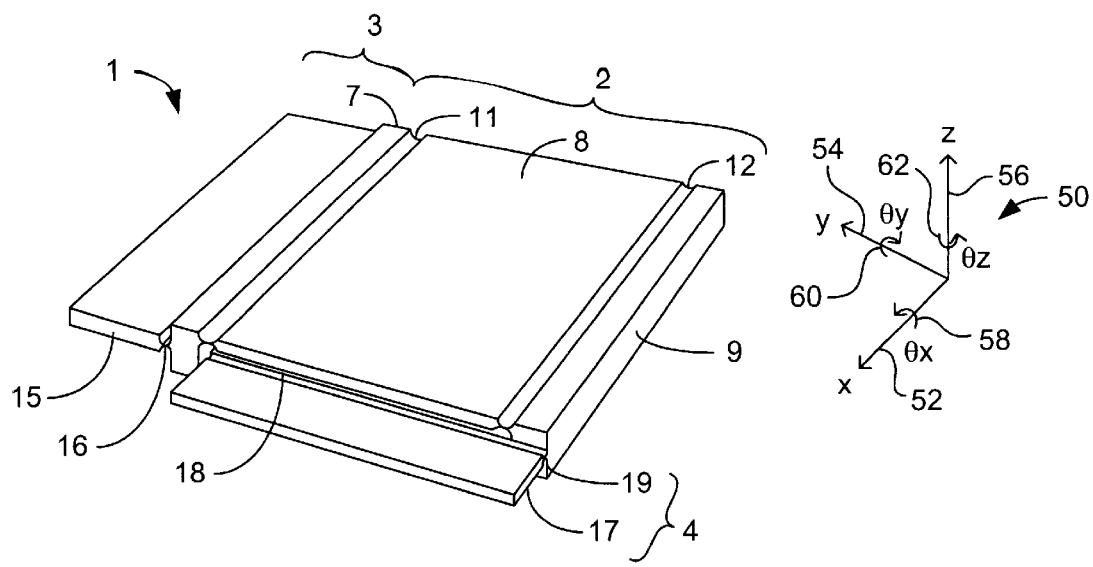
FIG. 1 illustrates a perspective view of a preferred embodiment of the inventive three-degree of freedom joint.

A preferred embodiment of a flexural joint 1 is illustrated in perspective view in FIG. 1. The joint 1 is positioned respective to a three-dimensional coordinate system 50 so that the structure and operation of the joint 1 may be clearly explained. The coordinate system 50 defines the six degrees of possible motion, which are the three translational directions and the three rotational motions. The three translational directions, x, y and z, are indicated by the orthogonal axis' 52, 54 and 56. The three rotational directions $\Theta_x$, $\Theta_y$ and $\Theta_z$, are indicated by rounded directional arrows 58, 60 and 62.

Flexural joint 1 includes three joints 2, 3 and 4, which allow for freedom of relative movement between two objects attached to joint 1 in the z, $\Theta_x$ and $\Theta_y$ directions, respectively. Conversely, this means that joint 1 substantially prevents relative motion in the x, y, and $\Theta z$ directions. Each of the attached objects, for example, components of a semiconductor-processing machine, are attached to one of the rigid members 15 and 17. Joint 2 is a translational joint that flexes and allows the components to move relative to each other in the z-direction. Joint 3 is a rotational joint that flexes and allows the components to rotate about each other in the $\Theta x$ direction. Joint 4 is a rotational joint that flexes and allows the components to rotate about each other in the $\Theta y$ direction. In many machines, including semiconductor-manufacturing machines, components are only meant to move relative to each other in predetermined directions. Therefore, joints such as joint 1 are required to guide the components through their designed movements. For further description as to semiconductor-processing machines that can incorporate joint 1, please refer to provisional patent application No. 60/226,409, entitled "Cantilever Reticle Stage for Electron Beam Projection Lithography System."

To allow for the easier visualization of joint 1, many of the yet unmentioned sections of joint 1 have already been designated with reference numbers. These reference numbers will correspond to the joint sections as shown in the various perspective views in the following FIGS. 2–4A.

Figure 2:
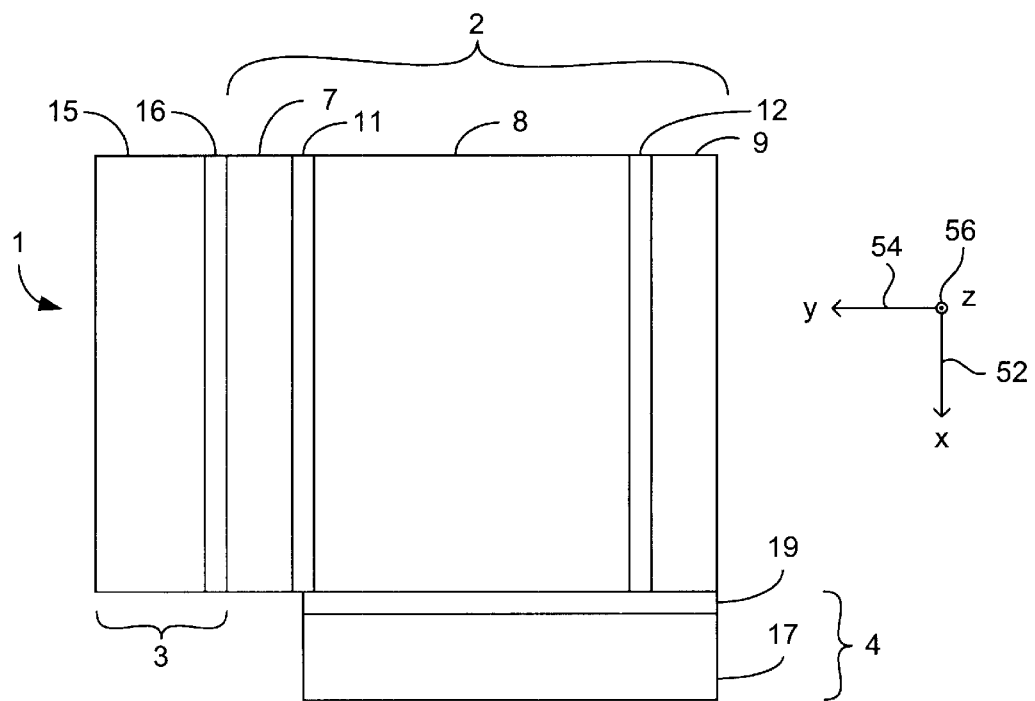
FIG. 2 illustrates a top plan view of the joint illustrated in FIG. 1.

FIG. 2 illustrates a top plan view of joint 1, which is a view looking down the z-axis 56. FIGS. 1 and 2 show that the machine components attached to rigid members 15 and 17 will be fixed at right angles from each other with respect to joint 1.

Figure 3:
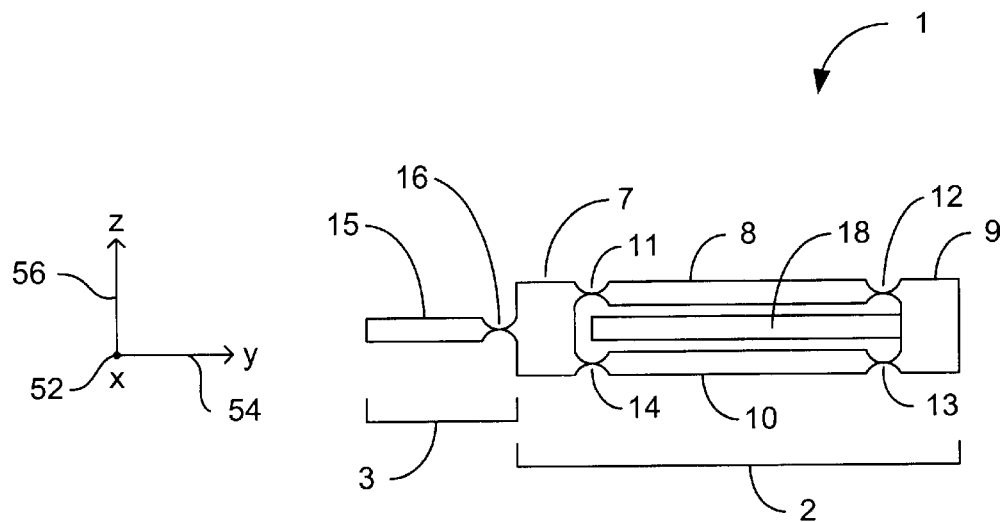
FIG. 3 illustrates a side plan view of the joint, as illustrated in FIGS. 1 and 2, in the positive x-direction.

FIG. 3 illustrates a side plan view of joint 1 that is directed in the positive x-direction along the x-axis 52. FIG. 3 thereby shows the "backside" of joint 1 with respect to FIG. 1. FIG. 3 will be used to show the sections of joint 1 that make up the translational joint 2 and the rotational joint 3.

First, the translational joint 2 includes four rigid members 7, 8, 9, and 10, and four flexural members 11, 12, 13, and 14. Rigid members 8 and 10 are plate-like in shape and rigid members 7 and 9 are generally shaped like elongated rectangular blocks. The flexural members 11–14 are thin and elongated members that bend in the $\Theta x$ direction. The flexural and rigid members are alternatively arranged and linked together such that the first rigid member 7 is attached to the first flexural member 11; the first flexural member 11 is attached to the second rigid member 8; the second rigid member 8 is attached to the second flexural member 12 and so on; finally, the fourth flexural member 14 is attached to the first rigid member 7. Flexural members 11, 12, 13 and 14 in translational joint 2 must be parallel to each other and orthogonal to the desired translation direction (in this case, the z-direction), but they can be oriented anywhere in the x-y plane. In one embodiment, any two adjacent pairs of flexural members in the translational joint 2 are equidistant from a remaining two pairs of flexural members. In other embodiments, the pairs of flexures need not be equidistant, i.e. rigid members 7, 8, 9 and 10 need not form a parallelogram. For example, if rigid members 8 and 10 are not parallel, then rigid member 7 will partially rotate as it translates relative to rigid member 9. Since flexural member 16 decouples this rotation from rigid member 15, it is not problematic. The flexural members are pieces of material that are thin enough so that they may bend back and forth, thereby allowing objects attached to each side of a flexural member to rotate about each other. The flexural members may be made of the same material that forms the rigid members, but they may be made of different materials.

For purposes of simplifying the naming convention in this present invention, rigid member 9 will be referred to as the base rigid member 9. It is noted, however, that the use of the word "base" does not imply that base rigid member 9 is the lowest rigid member of the three-degree of freedom joint, nor should "base" be inferred to mean that base rigid member 9 is in anyway immobile during the joints movements. The word "base" is used only for the purposes of the naming convention and does not imply any special or conventional meanings.

Translational joint 2 flexes such that components attached to rigid member 15 and rigid member 17 can move relative to each other along the z-axis 56. During translation in the z-direction, all four flexural members 11–14 flex and allow rigid members 7–10 to move relative to each other. For example, when rigid member 15 and its attached component moves above rigid member 17 and its attached component (rigid member 17 is behind joint 1 and therefore out of view in FIG. 3), rigid member 7 will rise above base rigid member 9. At the same time, rigid members 8 and 10 rotate while remaining parallel to each other. The outline of the flexed joint 1 from the perspective in FIG. 3 would have a parallelogram shape wherein the left side would be higher than the right side. Since rigid member 17 is connected to rigid member 18, through flexural joint 19, and rigid member 18 is connected to base rigid member 9, rigid member 17 moves in tandem with base rigid member 9 along the z-axis 56. As should be appreciated, when rigid member 15 moves below rigid member 17, rigid member 7 will fall below base rigid member 9. The resulting outline of the flexed joint 1 would have a parallelogram shape wherein the left side would be lower than the right side. As can be seen, the length of the rigid member 18 along the y-axis 54 runs in between rigid members 8 and 10.

Rigid member 18 ultimately will limit the range of movement along the z-axis 56 when the end of rigid member 18 comes in contact with rigid member 8 or 10. Rigid member 18 will eventually come in contact with rigid member 10 when rigid member 15 rises above rigid member 17. On the other hand, rigid member 18 will eventually come into contact with rigid member 8 when rigid member 15 falls below rigid member 17. As will be described in subsequent FIG. 7, rigid member 18 may be rectangular or triangular in shape.

As the rigid members 15 and 17 move along the z-axis 56, the various flexural members 11–14 and 16 can flex to varying degrees so that the attached components undergo movement only in the z-direction, as opposed to any residual rotations or yaw about any of the other axis'. The movements and positions of the attached components will ultimately be controlled by actuators or other mechanisms within the machine system.

Since the rigid members 8 and 10 rotate about flexural members 11–14, there will tend to be an inherent but minimal amount of relative translation between the attached components along the y-axis 54. The amount of translation along the y-axis is negligible for small z-translations.

Secondly, the rotational joint 3 includes rigid member 15 and flexural member 16. Rigid member 15 is attached to rigid member 7 through flexural member 16. Rigid member 15 is flat and elongated in shape. Flexural member 16 is parallel to the x-axis. Preferably, flexural member 16 is equidistant from flexural members 11 and 14. Rotational joint 3 flexes such that the component attached to rigid member 15 rotates about flexural member 16, which means the component rotates about the x-axis 52.

Figure 4A:
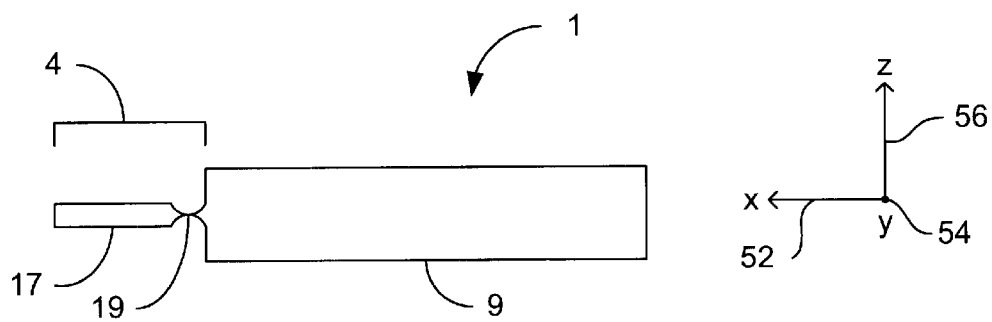
FIG. 4A illustrates a side plan view of the joint, as illustrated as FIGS. 1, 2 and 3, in the positive y-direction.

FIG. 4A is now presented to describe rotational joint 4. FIG. 4A illustrates a side plan view of joint 1 that is directed in the positive y-directions along the y-axis 54. FIG. 4A therefore, looks upon base rigid member 9, flexural member 19 and rigid member 17. Rigid member 17 is flat and elongated in shape, and flexural member 19 is parallel to the y-axis. With respect to the structure of joint 4, rigid member 17 is connected to both rigid members 9 and 18 through flexural member 19. Rigid members 9 and 18 provide the support needed so that the component attached to rigid member 17 rotates only in the $\Theta y$ direction. It is not necessary that rigid member 17 be supported throughout the entire length of rigid member 18 and 9, however, in this manner, support is maximized. In alternative embodiments, rigid member 17 need not be connected to base rigid member 9.

It is noted that even though rotational joints 3 and 4 are illustrated such that they are orthogonal to each other, the rotational joints need not be in such an orientation. The axis of rotation for each rotational joint must be in the x-y plane (orthogonal to the translational degree of freedom), but, again, the rotational joints need not be orthogonal to each other.

In alternative embodiments the flexural members need not be continuous members. In other words, support provided to the rigid members can be provided by multiple flexural members along each axis. Each flexural member in this case would be smaller in size.

In preferred embodiments of the invention, rigid members 15 and 17 have mounting holes to bolt the members to the components to be attached. However, in alternative embodiments, rigid members 15 and 17 are not included since the flexural members can be directly attached to the components.

It should be appreciated that joint 1 can flex in manners such that the attached components move relative to each other in one, two or three degrees of freedoms at any time. For example, joint 1 may flex such that only motion in the z-direction is experienced, or he joint 1 may flex such that motion in the z, $\Theta x$ and $\Theta y$ directions are experienced simultaneously.

For a particular machine system in which flexural joint 1 is envisioned to be incorporated within, the flexural joint has low stiffness in each of the degrees of freedom measured to be: about 15 N/mm maximum in the z-direction, about $2.5 \times 10^7$ Nmm/radians maximum in the $\Theta_x$-direction, and about $3.7 \times 10^6$ Nmm/rad maximum in the $\Theta_y$-direction. At the same time, the flexural joint should have high stiffness values in each of the degrees of constraint of: about $1.6 \times 10^4$ N/mm minimum in the x-direction, about $2.3 \times 10^5$ N/mm minimum in the y-direction, and about $9.0 \times 10^6$ Nmm/rad minimum in the $\Theta_z$-direction. These values of low and high stiffness in the respective directions allows the components in the machine be positioned with respect to each other with smaller positioning errors while requiring less time positioning time.

In one embodiment, the flexural joint allows the rigid members 15 and 17 to move a distance in each degree of freedom (the stroke) of about: 1.5 mm maximum in the z-direction, about 1000 $\mu$radians in the $\Theta_x$-direction, and 1000 $\mu$rad in the $\Theta_y$-direction.

Figure 4B:
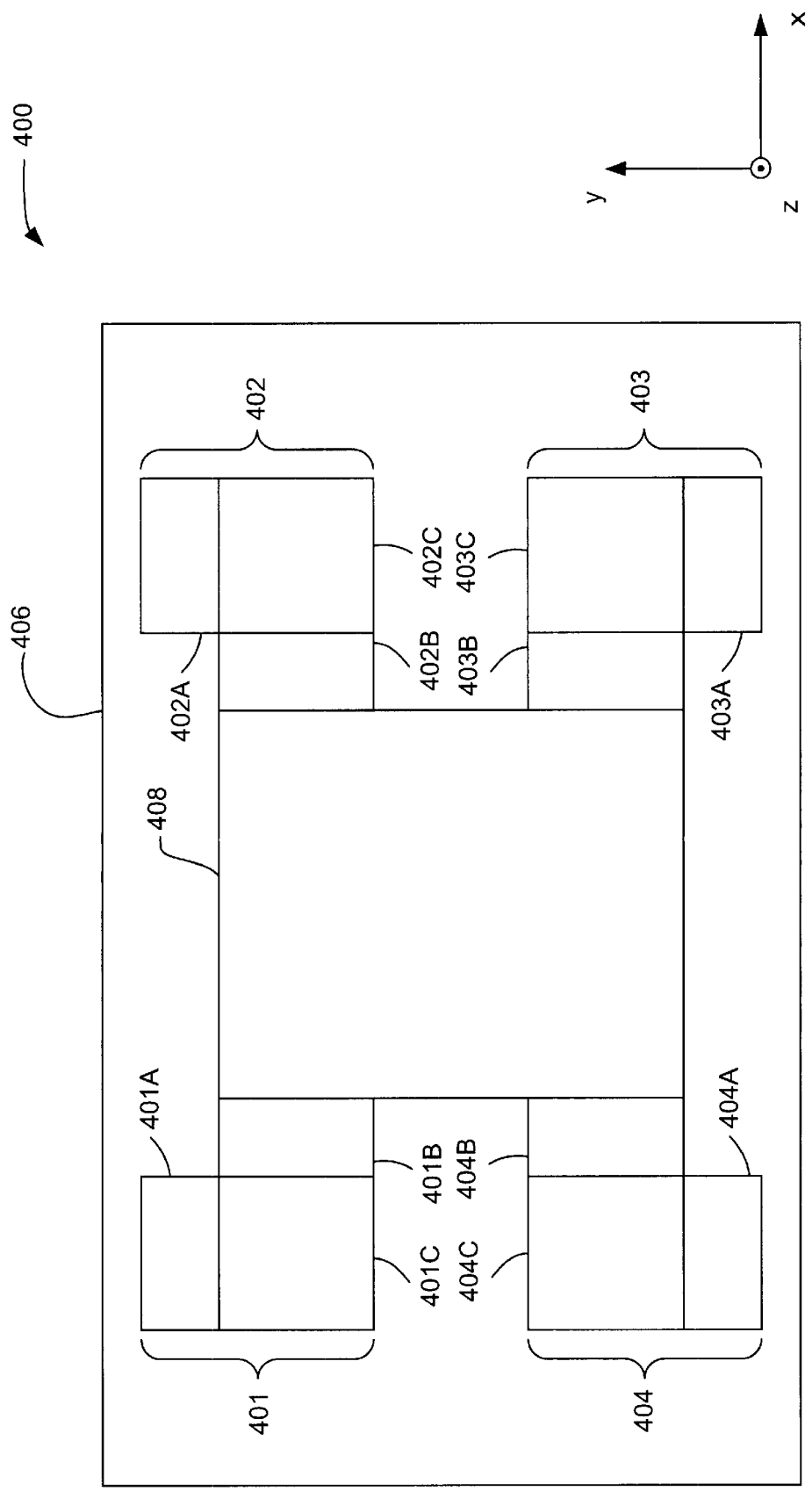
FIG. 4B illustrates a top plan view of one embodiment of a machine system in which two components are connected to each other through four three-degree of freedom joints.

Components may be connected to each other by a minimum of one to a plurality of four three-degree of freedom joints depending on the application or circumstances. For example, redundancy for safety, if one fails. FIG. 4B illustrates a top plan view of one embodiment of a machine system 400 wherein four three-degree of freedom joints 401, 402, 403 and 404 connect component 406 to component 408. Each of the three-degree of freedom joints 401–404 have rotational joints 401A, 402A, 403A, and 404A, and 401B, 402B, 403B, and 404B, and translational joints 401C, 402C, 403C, and 404C. Each of the rotational joints 401A, 402A, 403A, and 404A are connected to component 406 and each of rotational joints 401B, 402B, 403B, and 404B are connected to component 408. The joints providing the same rotational degree of freedom are aligned in parallel. For example, all of joints 401A, 402A, 403A, and 404A provide rotational freedom about the x-axis and therefore are aligned in parallel. Also, all of joints 401B, 402B, 403B, and 404B provide rotational freedom about the y-axis and therefore are aligned in parallel. The joints providing the same rotational degree of freedom and which flex in the same direction for relative rotation between components 406 and 408 are collinear. For example, the following pairs of joints are collinear: 401A and 402A, 403A and 404A, 401B and 404B, and 402B and 403B. The joints providing the same rotational degree of freedom and which flex in opposite directions for relative rotation between components 406 and 408 should be spaced relatively far apart. For example, joints 401A and 402A are spaced relatively far apart from joints 404A and 403A, and joints 401B and 404B are spaced relatively far apart from joints 402B and 403B. The joints providing the same translational degree of greedom should be aligned in parallel. For example, joints 401C, 402C, 403C and 404C are aligned in parallel. It should be noted that the embodiment of FIG. 4 is only exemplary and in no way should limit the scope of the invention. For example, in situations where packaging or material constraints prevent the use of one or a few three-degree of freedom joints, multiple joints can be used. Also, redundant joints can be used for safety purposes in the event that one joint fails.

Figure 5:
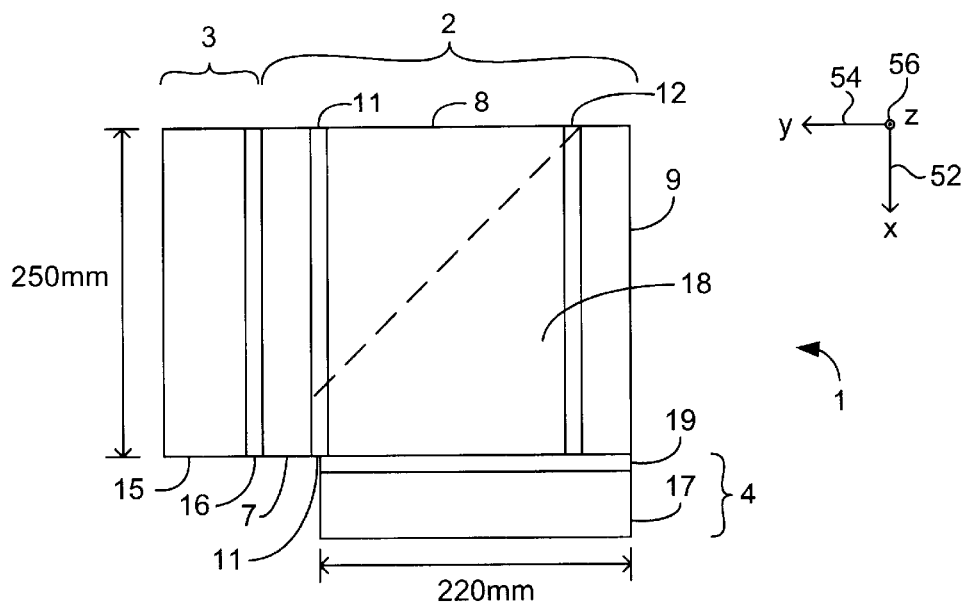
FIGS. 5–7 illustrate dimensions, in millimeters, of a three-degree of freedom joint according to one embodiment of the present invention.
Figure 6:
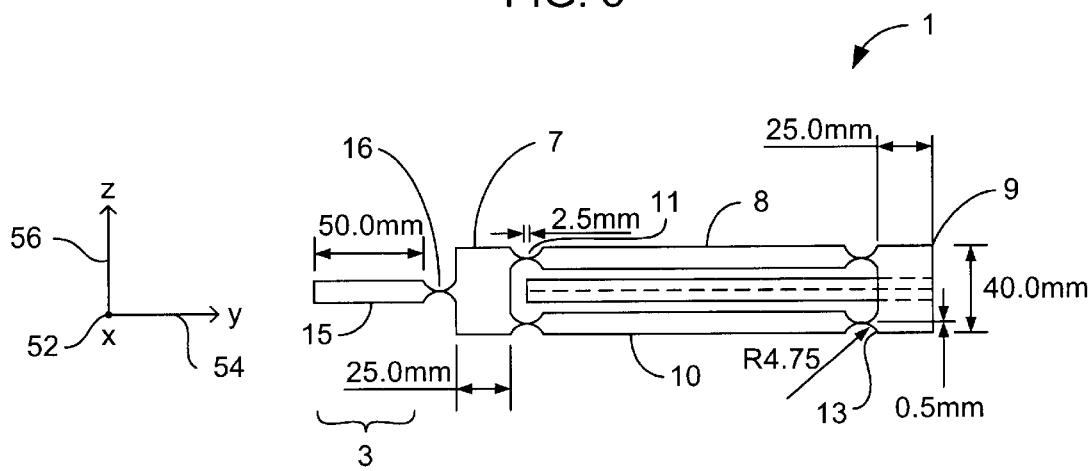
Figure 7:
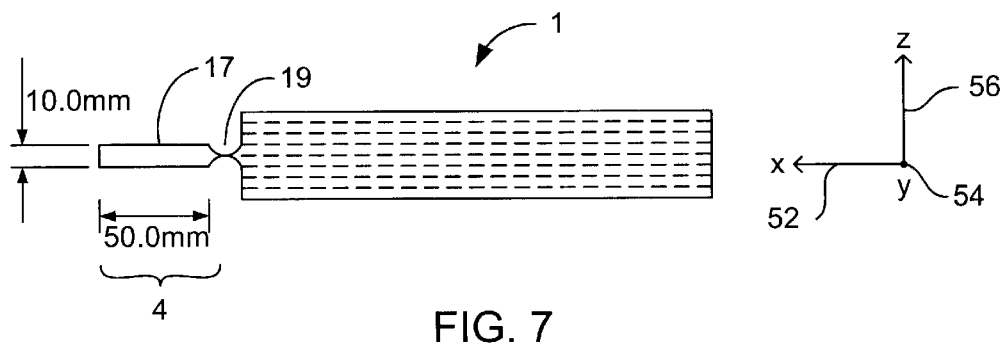

FIGS. 5–7 are now presented to disclose exemplary dimensions for the flexural joint 1 according to one embodiment of the present invention. FIG. 5 illustrates a top plan view of the three degree-of-freedom joint 1 directed down the z-axis 56. The rigid member 15 of joint 1 has a length of 250 millimeters (mm), and rigid member 17 has a length of 220 millimeters. A dashed line in FIG. 5 represents an alternative embodiment of rigid member 18 wherein member 18 has a triangular shape. The dashed line represents the hypotenuse of the right triangularly shaped triangle 18. The sides of the triangle forming the right angle are attached to base rigid member 9 and flexural member 19. Since the main function of rigid member 18 is to support rigid member 17, a full rectangularly shaped rigid member 18 is not needed.

FIG. 6 illustrates a side plan view of joint 1 that is directed in the positive x-direction along the x-axis 52. Rigid members 7 and 9 have widths of 25 millimeters. Rigid member 15 has a width of 50 millimeters. Flexural members 11–14 are offset from the upper and lower ends of the rigid members 7 and 9 by 0.5 millimeters. Each of the flexural members is formed of semi-circular indentations having a radius of 4.75 millimeters. Larger radii improve the fatigue life of the flexures and minimize stress concentration at the interface between the flexures and the rigid members. The middle section of each of the flexural members are flat portions that connect each of the end portions of the flexural members. Each of the two end portions of each flexural member is called a fillet. The flat portions are generally 2.5 mm in width. The flat portions are the portions of the flexural members that bend during flexing.

FIG. 7 illustrates a side plan view of joint 1 that is directed in the positive y-directions along the y-axis 54. According to FIG. 7, rigid member 17 has a height (or thickness) of 10 mm and a width of 50 mm. Rigid members 16 and 17 are typically at least twenty times thicker than the thickness of the flat portion of the flexures to ensure that the flexing occurs primarily in the flexure and not in the rigid members. Of course, the ratio of the thickness of the rigid members to the flat portion of the flexures may vary depending upon the materials used to form the flexures and rigid members. Therefore, rigid members 16 and 17 have no specific dimensional criteria.

In alternative embodiments, the positions at which each rigid member or flexural member is attached to each other may vary from those represented in FIG. 1. For example, flexural member 16 need not be positioned equidistant between flexural members 11 and 14. Various embodiments and geometries of the three-degree of freedom flexural joint will soon be described in FIGS. 8–17.

The three-degree of freedom joint according the present invention may be formed of a variety of materials. Such materials include but are not limited to metal, ceramic, plastic and wood. For example, the joint may be formed of stainless steel or titanium. Preferably, the three-degree of freedom joint is manufactured from a single piece of material. This may be accomplished by methods such as wire electron discharge machining (wire EDM). Wire EDM can be used on metal materials. In this process, a block of metal is shaped by using a high-voltage wire, which melts away sections of the metal. Wire EDM is able to remove metal at a very high tolerance and is therefore able to produce high quality flexural joints. Monolithic joints, made from a single piece of material, are advantageous in that they are less likely to produce particulates, have long useful lives, and are relatively compact. Alternatively, the joint may be formed from multiple components that are attached to each other.

Figure 8:
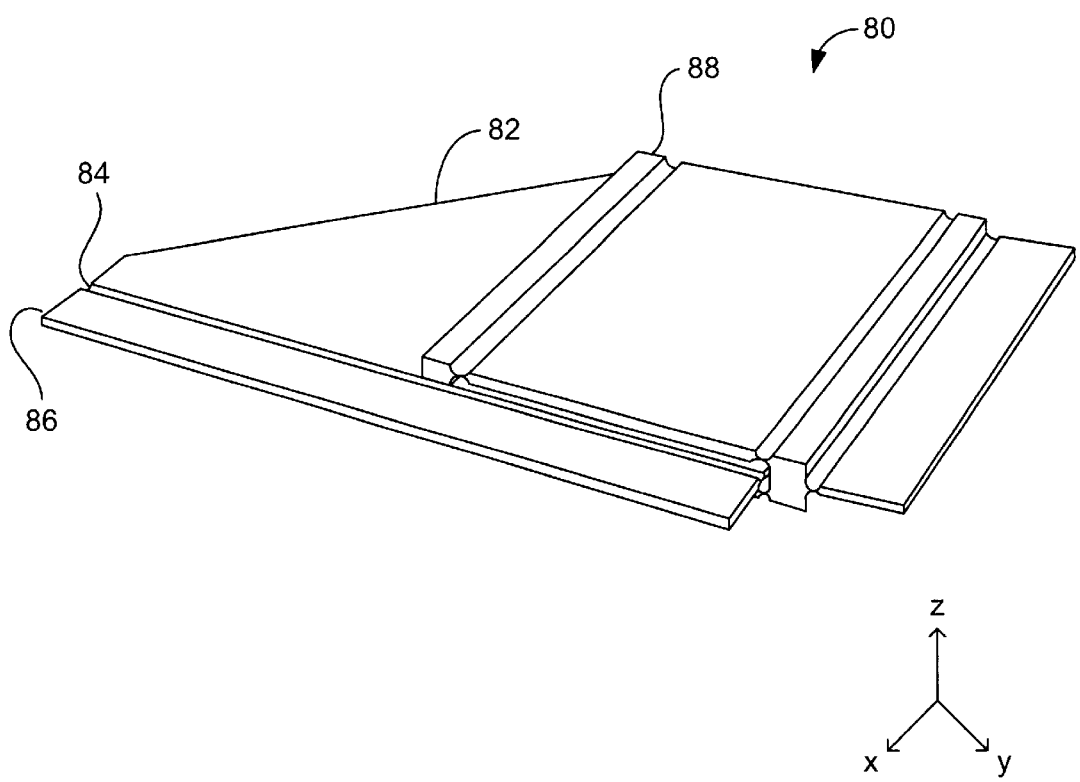
FIG. 8 illustrates a perspective view of one alternate embodiment of the three-degree of freedom joint that includes an extra triangular rigid member.

FIGS. 8–17 will now present alternative embodiments of the three-degree of freedom flexural joint. All of the following embodiments function essentially the same as joint 1 in FIG. 1 even though their structures are slightly different. FIG. 8 illustrates a perspective view of a three-degree of freedom flexural joint 80 which is essentially the same as joint 1 of FIG. 1, except that joint 80 has an extra triangular rigid member 82 and flexural member 84 and rigid member 86 are extended versions of flexural member 19 and rigid member 17 of FIG. 1, respectively. Extended members 17 and 19 are attached to triangular rigid member 82. Triangular rigid member 82 is also attached to base rigid member 88, thereby providing more support for rigid member 17 and its attached component. Of course, rigid member 82 may be rectangular in shape or the hypotenuse of member 82 may be arced.

Figure 9:
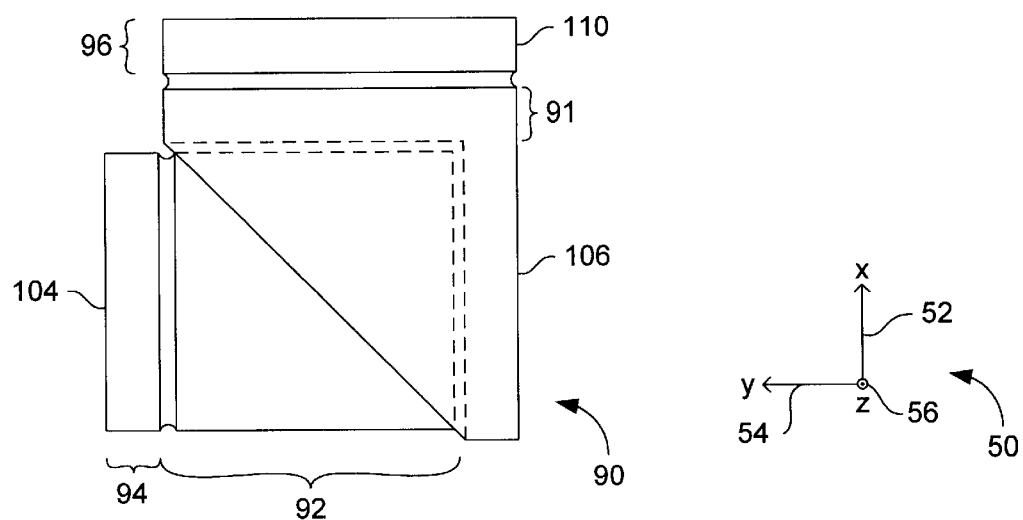
FIGS. 9–11 illustrate another alternative embodiment of the three-degree of freedom joint.
Figure 10:
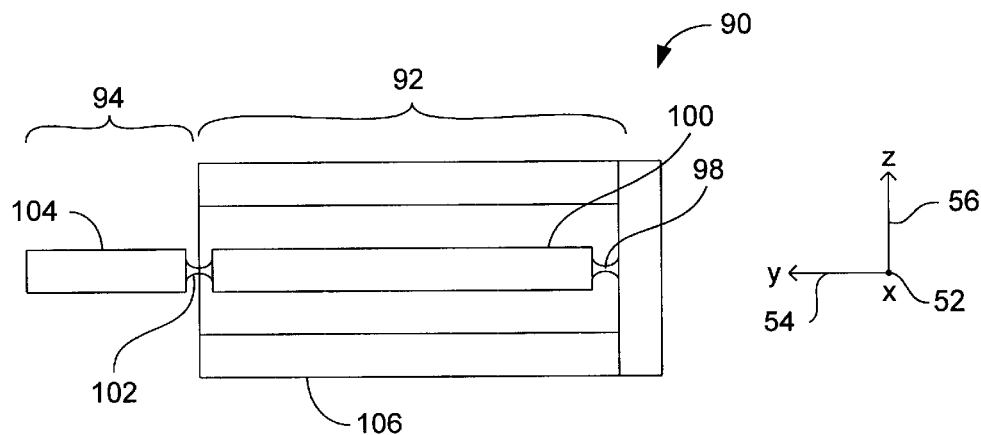
Figure 11:
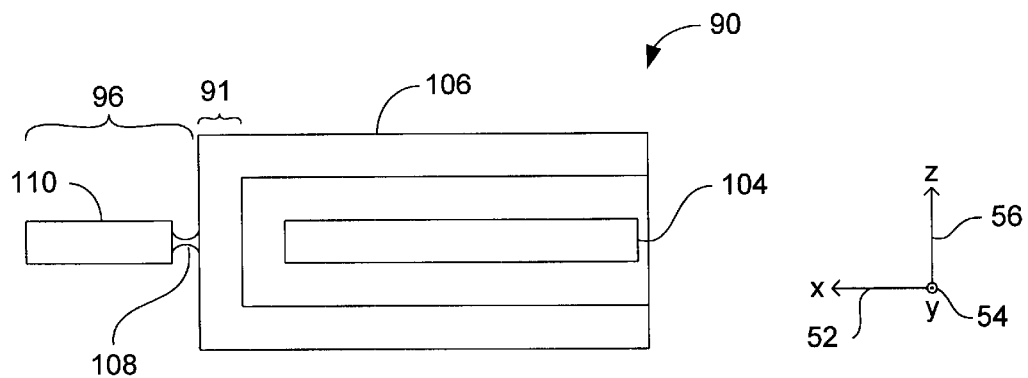

FIGS. 9–11 describe another alternative embodiment of the three-degree of freedom flexural joint. FIG. 9 illustrates a top plan view of joint 90. Joint 90 has a translational joint 92 for movement in the z-direction, a first rotational joint 94 for rotational movement in the $\Theta$x direction, and a second rotational joint 96 for rotational movement in the $\Theta$y direction.

As can be seen in FIG. 10, which is a side plan view of joint 90 in the positive x-direction, translational joint 92 is formed of flexural member 98 and rigid member 100. As compared to the translational joint 2 of flexural joint 1 of FIG. 1, which had four rigid members and four flexural members, joint 92 of FIG. 10 has less components. The movement of member 100 in the z-direction will be limited by base rigid member 106, which is the backwards "c" shaped member surrounding rigid member 100. FIG. 10 also shows the first rotational joint 94, which is formed from flexural member 102 and rigid member 104.

FIG. 11 illustrates a side plan view of joint 90 which looks down the y-axis 54. In FIG. 11, joint 96 can be seen to be formed of flexural member 108 and rigid member 110. Base rigid member 106 is triangular in shape and supports rigid member 110. From the perspective in FIG. 1, rigid member 104 can be seen in its un-deformed position, which places it in between the plates of base rigid member 106, with respect to the z-direction. As mentioned above, joint 90 functions similarly to joint 1 in that freedom of movement is substantially provided in only the z, Θx and Θy directions. Portion 91 of base member 106 is inherently the support member portion which supports the flexural member 108. Portion 91 can also be seen in FIG. 9.

Figure 12:
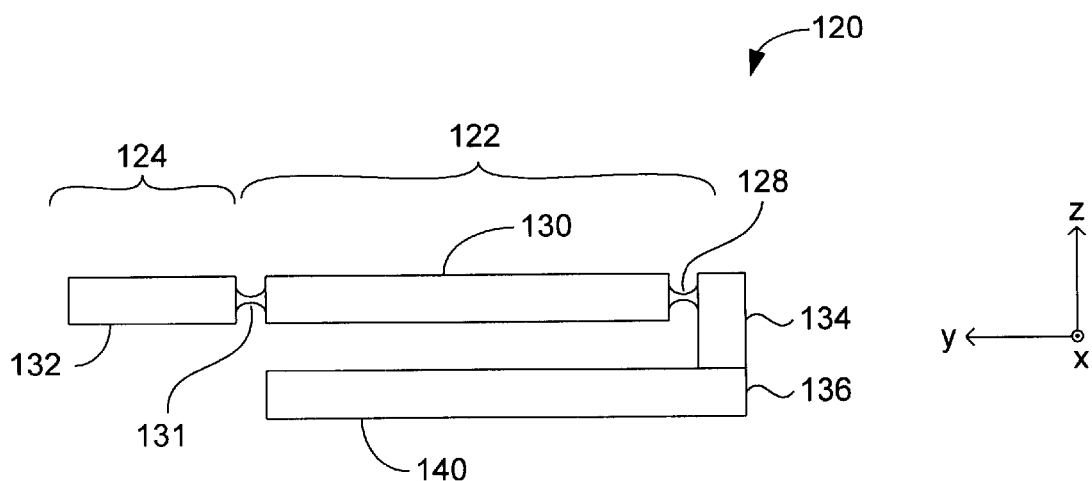
FIGS. 12–13 illustrate yet another alternative embodiment of the three-degree of freedom joint.
Figure 13:
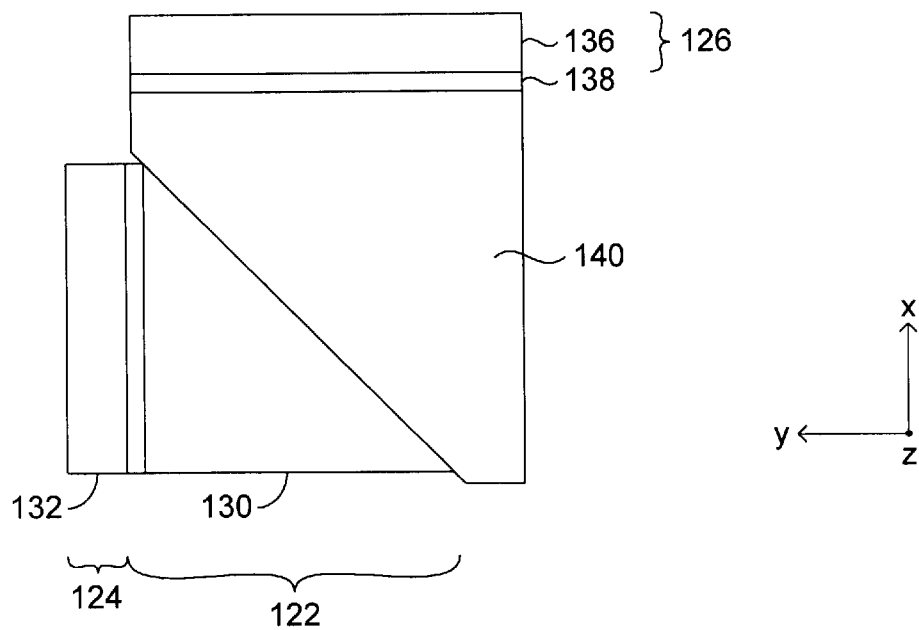

FIGS. 12 and 13 show yet another alternative embodiment of the three-degree of freedom flexural joint. FIG. 12 illustrates a side plan view of joint 120. Joint 120 has translational joint 122, a first rotational joint 124 and a second rotational joint 126. The translational joint, for movement in the z-direction, is formed of flexural member 128 and rigid member 130. Flexural member 128 connects rigid member 130 to base rigid member 134. The first rotational joint 124, which allows for rotation about the x-axis, is formed by flexural member 131 and rigid member 132.

FIG. 13 illustrates a plan view of joint 120 directed in the positive z-direction, in other words, a view from the bottom of the joint 120. As can be seen, second rotational joint 126 is formed from rigid member 136 and flexural member 138, wherein member 138 connects member 136 to rigid member 140. Once again, rigid member 140 is triangular shaped. In the embodiment of joint 120, the translational joint 122 is offset from the middle of the height of joint 120.

Figure 14:
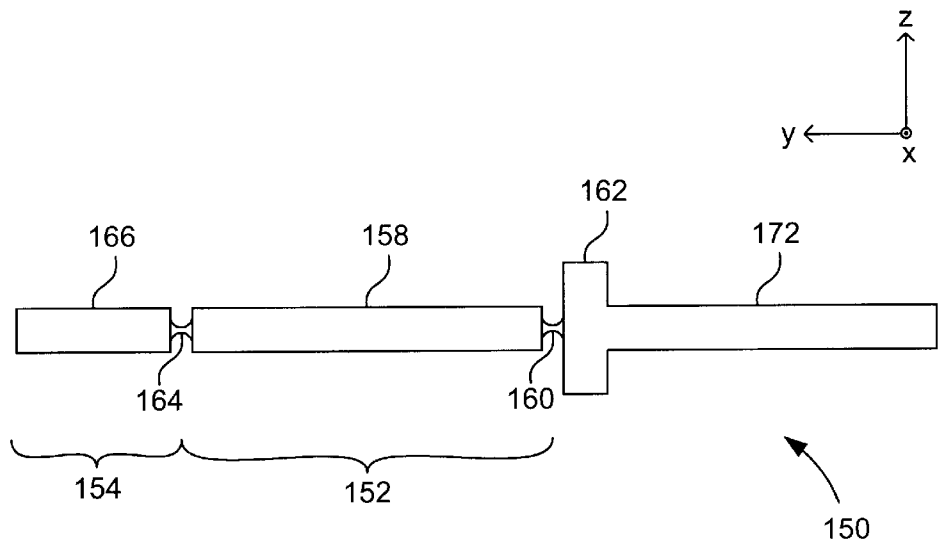
FIGS. 14–15 illustrate yet another alternative embodiment of the three-degree of freedom joint.
Figure 15:
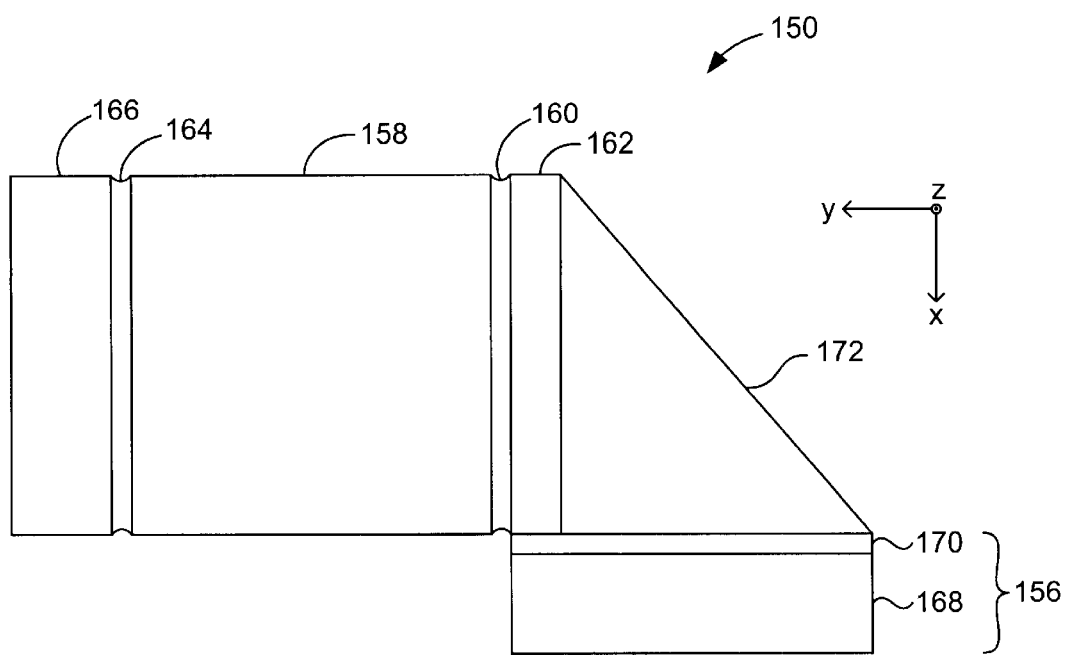

FIGS. 14 and 15 show yet another alternative embodiment of the three-degree of freedom flexural joint. FIG. 14 illustrates a side plan view of joint 150. Joint 150 has translational joint 152, a first rotational joint 154 and a second rotational joint 156. The translational joint 152, for movement in the z-direction, is formed of flexural member 160 and rigid member 158. Flexural member 160 connects rigid member 158 to base rigid member 162. The first rotational joint 154, which allows for rotation about the x-axis, is formed by flexural member 164 and rigid member 166.

FIG. 15 illustrates a plan view of joint 150 directed in the negative z-direction. As can be seen, second rotational joint 156 is formed from rigid member 168 and flexural member 170, wherein flexural member 170 connects member 168 to rigid member 172. Once again, rigid member 172 is triangular shaped. In the embodiment of joint 150, the translational joint 152 is centered in the middle of the height of joint 150.

Figure 16:
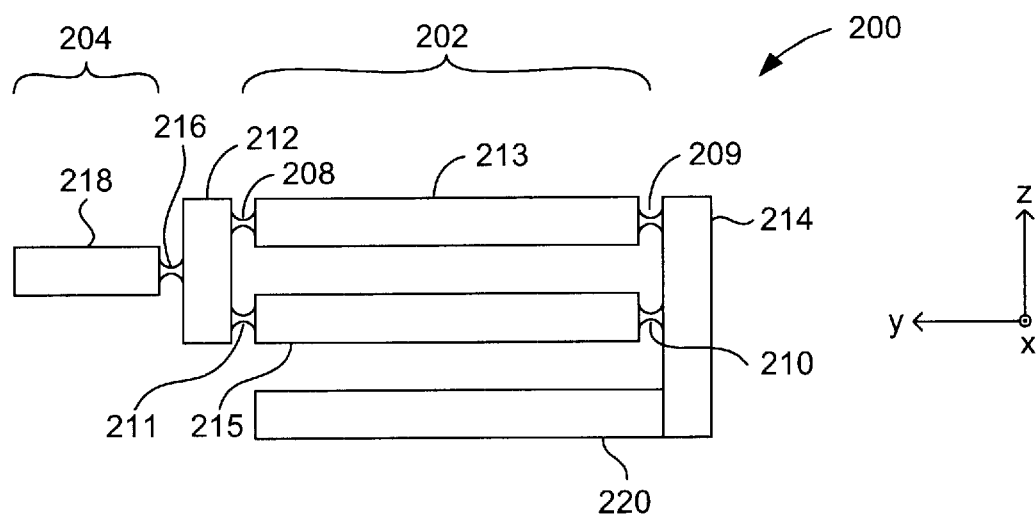
FIGS. 16–17 illustrate yet another alternative embodiment of the three-degree of freedom joint.
Figure 17:
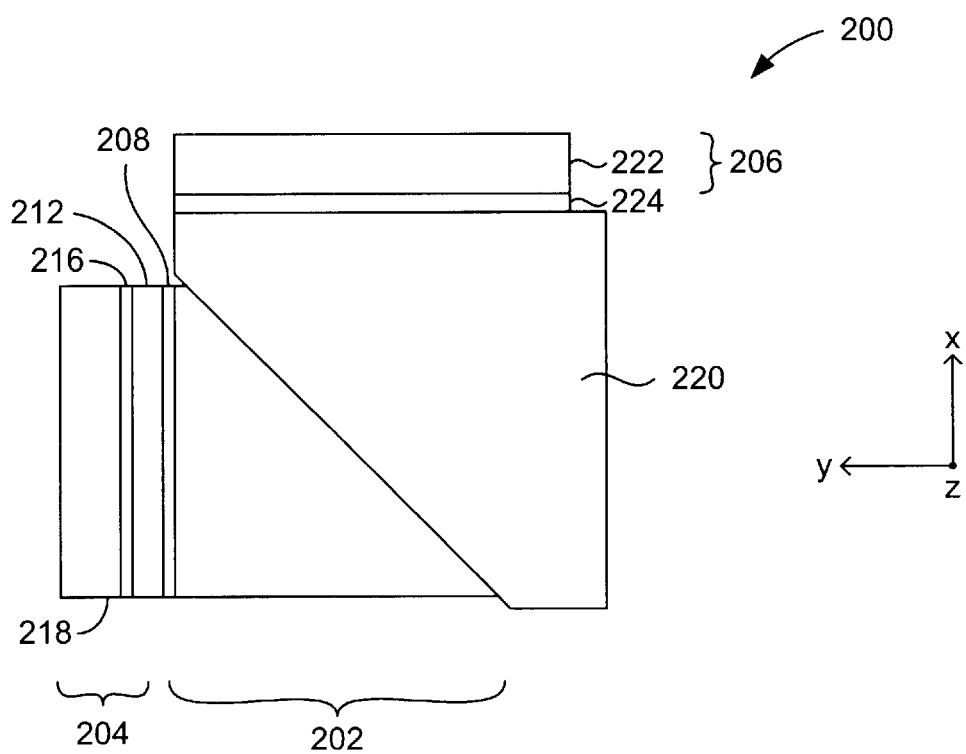

FIGS. 16 and 17 show yet another alternative embodiment of the three-degree of freedom flexural joint. FIG. 16 illustrates a side plan view of joint 200. Joint 200 has translational joint 202, a first rotational joint 204 and a second rotational joint 206. The translational joint 202, for movement in the z-direction, is formed of flexural members 208, 209, 210, and 211, and rigid members 212, 213, 214, and 215. The translational joint 202 acts in the same way translational joint 2 behaves in FIG. 1. The position of translational joint 202, however, is off-center from the height of the flexural joint 200. The first rotational joint 204, which allows for rotation about the x-axis, is formed by flexural member 216 and rigid member 218. Rigid member 220 is a triangular shaped flat rigid member that supports rigid member 222, which rotates about the y-axis. As can be seen, rigid member 220 is positioned below the translational joint 202.

FIG. 17 illustrates a plan view of joint 200 directed in the positive z-direction, in other words, a view from the bottom of the joint 200. As can be seen, second rotational joint 206 is formed from rigid member 222 and flexural member 224, wherein flexural member 224 connects member 222 to rigid member 220.

Table 1 below represents the relative preference as to the various embodiments of the three-degree of freedom joints presented in the present disclosure. Five of the embodiments are rated and compared to each other according to the degree of compactness of the joints, the stiffness, S, in the various directions, and the compliance, C, in the various directions. A total rating (the overall preference value) for each embodiment is presented in the last column of Table 1. The rating system is based upon three scores: "+" being above average, "0" being average, and "–" being below average. The Figures column of Table 1 lists the various Figures in which the specific embodiments are illustrated.

TABLE 1

| Embodiment | FIGS. | Compactness of Size | $S_x$ | $S_y$ | $S\theta_z$ | $C\theta_x$ | $C\theta_y$ | $C_z$ | One-piece fabrication | Total |
|---|---|---|---|---|---|---|---|---|---|---|
| 1 | 1–7 | 0 | 0 | 0 | 0 | 0 | 0 | 0 | 0 | 0 |
| 2 | 8 | – | + | + | + | – | 0 | 0 | 0 | + |
| 3 | 9–11 | 0 | – | 0 | – | + | 0 | + | – | – |
| 4 | 12–13 | 0 | – | – | – | + | 0 | + | 0 | – |
| 5 | 14–15 | – | – | 0 | – | + | 0 | + | 0 | – |
| 6 | 16–17 | 0 | – | – | – | 0 | 0 | 0 | 0 | — |

According to Table 1, embodiment 2 ranks higher when the various criteria are given equal weight. However, when the size factor for the joints is critical, embodiment 1 is preferred.

While this invention has been described in terms of several preferred embodiments, there are alteration, permutations, and equivalents, which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

We claim:

1. A three-degree of freedom joint suitable for guiding the relative motion between two components within a machine system, the three-degree of freedom joint being aligned with a coordinate system having x, y and z axes that are orthogonal to each other, there being a respective rotational direction Θx, Θy and Θz about each of the x, y and z axes, the three-degree of freedom joint comprising:
- a translational joint that allows a first component and a second component to be moved with respect to each other along the z-axis, the translational joint including four translational flexural members and four rigid members, each of the rigid members having two ends wherein each end of each rigid member is connected to the end of another rigid members through a respective translational flexural members, one of the four rigid members being a base rigid member;
- a first support member that is fixedly attached to the base rigid member such that the first support member and the base rigid member are fixed in orientation with respect to each other;
- a first rotational joint that allows the first component and the second component to be moved with respect to each other in the Θx direction, the first rotational joint including a first rotational flexural member that is connected to the rigid member opposite the base rigid member; and
- a second rotational joint that allows the first and second component to be moved with respect to each other in the Θy direction, the second rotational joint including a second rotational flexural member that is connected to the first support member;
- wherein the three-degree of freedom joint substantially prevents the first and second components from moving with respect to each other in the x, y, and Θz directions.

2. A three-degree of freedom joint as recited in claim 1 wherein the first support member is positioned between the four rigid members of the translational joint.

3. A three-degree of freedom joint as recited in claim 1 further comprising:
- a first attachment member that is connected to the first rotational flexural member of the first rotational joint such that the first attachment member can rotate in the Θx direction, the first attachment member being suitable for attachment to the first component whereby the first component is connected to the three-degree of freedom joint via the first attachment member, and whereby the first component can move in the Θx direction together with the first attachment member; and
- a second attachment member that is connected to the second rotational flexural member of the second rotational joint such that the second attachment member can rotate in the Θy direction, the second attachment member being suitable for attachment to the second component whereby the second component is connected to the three-degree of freedom joint via the second attachment member, and whereby the second component can move in the Θy direction together with the second attachment member.

4. A three-degree of freedom joint as recited in claim 1 wherein the four translational flexural members of the translational joint run along the x-axis, the first rotational flexural member of the first rotational joint runs along the x-axis, and the second rotational flexural member of the second rotational joint runs along the y-axis.

5. A three-degree of freedom joint as recited in claim 1 wherein the four rigid and translational flexural members form a substantially rectangular outline.

6. A three-degree of freedom joint as recited in claim 1 wherein the support member is in the shape of a right triangle.

7. A three-degree of freedom joint as recited in claim 1 wherein the entire three-degree of freedom joint is formed from a single piece of material.

8. A three-degree of freedom joint as recited in claim 1 wherein the second rotational flexural member is also connected to the base rigid member.

9. A three-degree of freedom joint as recited in claim 1 further comprising a second support member, the second support member being fixedly attached to the opposite side of the base rigid member from which the first supporting member is attached whereby the first support member, the second support member, and the base rigid member are fixed in orientation with respect to each other, the second rotational flexural member extending along and being attached to the second support member.

10. A three-degree of freedom joint, the three-degree of freedom joint being aligned with a coordinate system having x, y and z axes that are orthogonal to each other, there being a respective rotational direction Θx, Θy and Θz about each of the x, y and z axes, the three-degree of freedom joint comprising:
- a translational joint that allows a first component and a second component to be moved with respect to each other along the z-axis, the translational joint including a first translational flexural member that connects a first rigid member and a base rigid member, wherein a translational flexural member is a flexural member that facilitates translational movement between the first and the second components;
- a first support member that is fixedly attached to the base rigid member such that the first support member and the base rigid member are fixed in orientation with respect to each other;
- a first rotational joint that allows the first component and the second component to be moved with respect to each other in the Θx direction, the first rotational joint including a first rotational flexural member that is attached to the first rigid member, wherein a rotational flexural member is a flexural member that facilitates rotational movement between the first and the second components; and
- a second rotational joint that allows the first component and second component to be moved with respect to each other in the Θy direction, the second rotational joint including a second rotational flexural member that is attached to the first support member;
- wherein the three-degree of freedom joint substantially prevents the first and second components from moving with respect to each other in the x, y, and Θz directions.

11. A three-degree of freedom joint as recited in claim 10 further comprising:
- a first attachment member that is connected to the first rotational flexural member of the first rotational joint such that the first attachment member can rotate in the Θx direction, the first attachment member being suitable for attachment to the first component whereby the first component is connected to the three-degree of freedom joint via the first attachment member, and whereby the first component can move in the Θx direction together with the first attachment member; and
- a second attachment member that is connected to the second rotational flexural member of the second rotational joint such that the second attachment member can rotate in the Θy direction, the second attachment member being suitable for attachment to the second component whereby the second component is connected to the three-degree of freedom joint via the second attachment member, and whereby the second component can move in the Θy direction together with the second attachment member.

12. A three-degree of freedom joint as recited in claim 10 wherein the translational joint further includes a second and a third rigid member, and a second, third and fourth translational flexural member, the second translational flexural member connecting the first and second rigid members, the third translational flexural member connecting the second and third rigid members, and the fourth translational flexural member connecting the third and base rigid members such that the first, second, third and base rigid members substantially form a rectangular outline, also wherein the first rotational flexural member is connected to the second rigid body, the first rotational flexural member thereby being attached to the first rigid body through the second rigid body and the second translational flexural member.

13. A three-degree of freedom joint as recited in claim 12 wherein the first support member is positioned between the rigid members of the translational joint.

14. A three-degree of freedom joint as recited in claim 12 wherein the first support member is positioned parallel and adjacent to either the first or third rigid member of the translational joint.

15. A three-degree of freedom joint as recited in claim 10 wherein the first translational flexural member of the translational joint runs along the x-axis, the first rotational flexural member of the first rotational joint runs along the x-axis, and the second rotational flexural member of the second rotational joint runs along the y-axis.

16. A three-degree of freedom joint as recited in claim 10 wherein the first support member is in the shape of a right triangle.

17. A three-degree of freedom joint as recited in claim 10 wherein the entire three-degree of freedom joint is formed from a single piece of material.

18. A three-degree of freedom joint as recited in claim 10 further comprising a second support member, the second support member being fixedly attached to the opposite side of the base rigid member from which the first support member is attached whereby the first support member, the second support member, and the base rigid member are fixed in orientation with respect to each other, the second rotational flexural member extending along and being attached to the second support member.

19. A three-degree of freedom joint as recited in claim 10 wherein the first support member is integrally formed with the base rigid member to form a support-base rigid member, the support-base rigid member having two parallel and triangularly shaped plates, the first rigid member positioned between the two triangularly shaped plates of the support-base rigid member.

20. A three-degree of freedom joint as recited in claim 10 wherein the first support member is positioned parallel to and adjacent to the first rigid member.

21. A three-degree of freedom joint as recited in claim 10 wherein the first support member is attached to the side of the base rigid member that is opposite the first rigid member.

* * * * *